United States Patent [19]
Chiba

[11] Patent Number: 5,805,356
[45] Date of Patent: Sep. 8, 1998

[54] PROJECTION EXPOSURE APPARATUS

[75] Inventor: Hiroshi Chiba, Yokohama, Japan

[73] Assignee: Nikon Corporation, Japan

[21] Appl. No.: 594,539

[22] Filed: Jan. 31, 1996

[30] Foreign Application Priority Data

Feb. 2, 1995 [JP] Japan .................................. 7-015609

[51] Int. Cl.$^6$ .......................... G02B 17/00; G03B 27/42
[52] U.S. Cl. ...................... 359/727; 359/730; 359/732; 355/53
[58] Field of Search ..................... 359/727, 730, 359/732, 734, 735, 736, 364, 650, 649; 355/43, 53, 51

[56] References Cited

U.S. PATENT DOCUMENTS

| | | | |
|---|---|---|---|
| 4,103,989 | 8/1978 | Rosin ....................................... | 359/730 |
| 4,171,870 | 10/1979 | Brunning et al. ....................... | 359/487 |
| 4,171,871 | 10/1979 | Dill et al. ................................ | 359/730 |
| 4,391,494 | 7/1983 | Hershel ................................... | 359/727 |
| 4,425,037 | 1/1984 | Hershel et al. .......................... | 355/43 |
| 5,031,977 | 7/1991 | Gibson .................................... | 359/355 |
| 5,298,939 | 3/1994 | Swanson et al. ........................ | 355/53 |
| 5,585,972 | 12/1996 | Markle ..................................... | 359/732 |

OTHER PUBLICATIONS

JP 07 057986, , Mar. 3, 1995 (Abstract), Patent Abstracts of Japan, vol. 95, No. 6, Jul. 31, 1995.
JP 07 218863, Aug. 18, 1995 (Abstract), Patent Abstracts of Japan, vol. 95, No. 11, Dec. 26, 1995.

*Primary Examiner*—Georgia Y. Epps
*Assistant Examiner*—Jordan M. Schwartz
*Attorney, Agent, or Firm*—Pennie & Edmonds LLP

[57] ABSTRACT

A projection exposure apparatus achieves good imaging performance as securing a sufficient working distance. This projection exposure apparatus has a projection optical system for projection-transferring a real-size image of a first object onto a second object, which is disposed between the first object and the second object. This projection optical system has a cemented lens consisting of a plano-convex lens and a first negative meniscus lens, a second negative meniscus lens, and path-bending prisms for guiding light from the first object to the plano-convex lens and for guiding light from the concave mirror to the second object. The present invention is based on finding of appropriate ranges of refractive powers of the first and second negative meniscus lenses and appropriate ranges of Abbe numbers of glass materials for the first and second negative meniscus lenses.

12 Claims, 10 Drawing Sheets

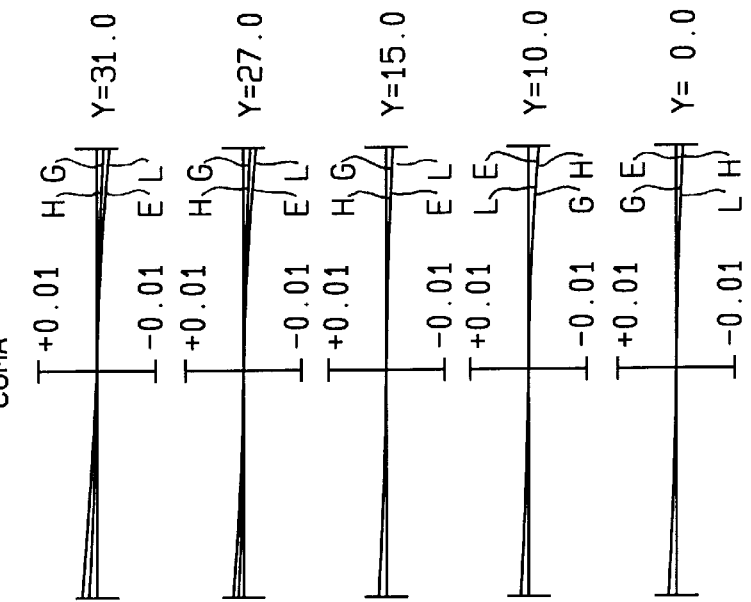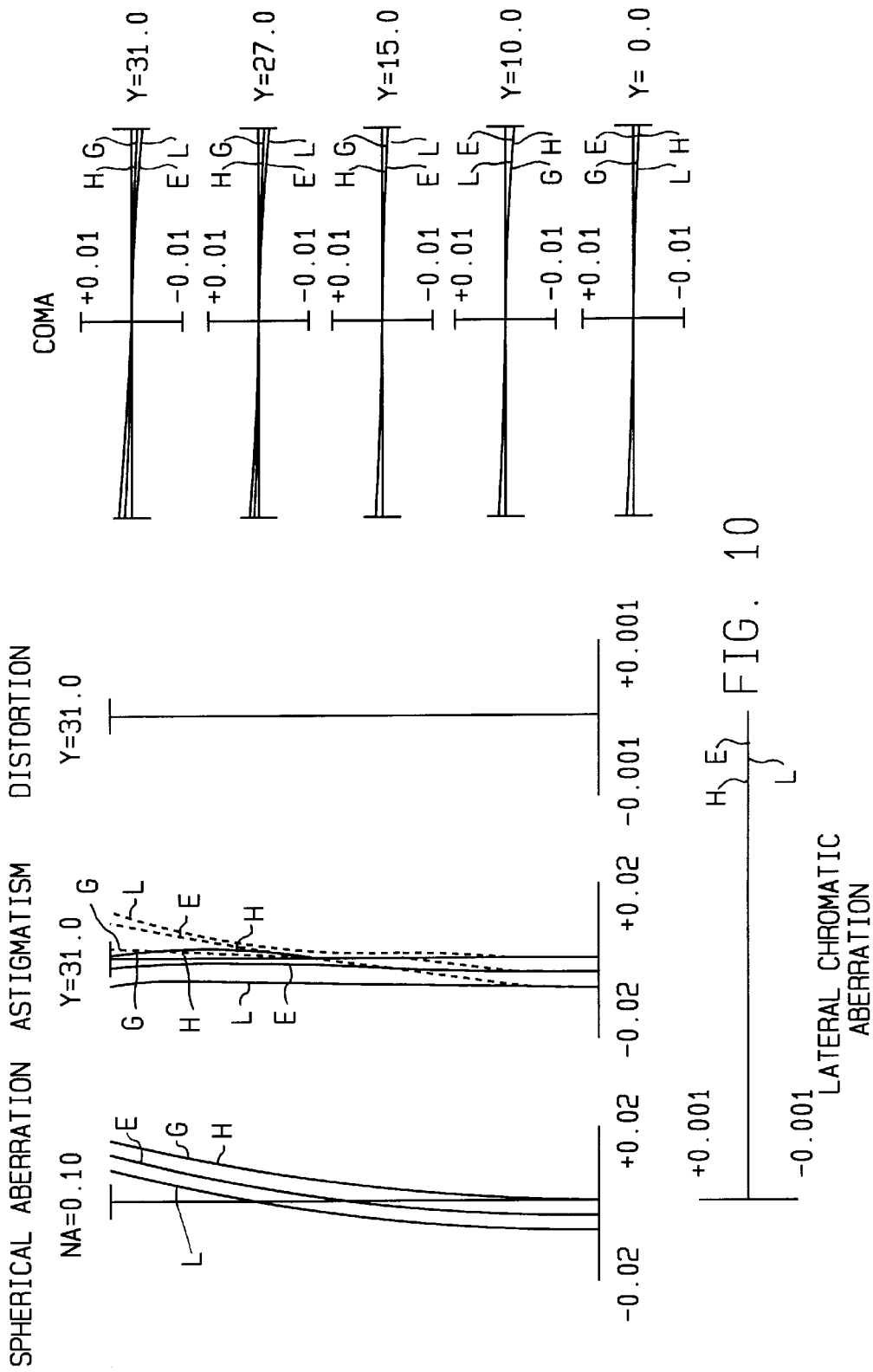

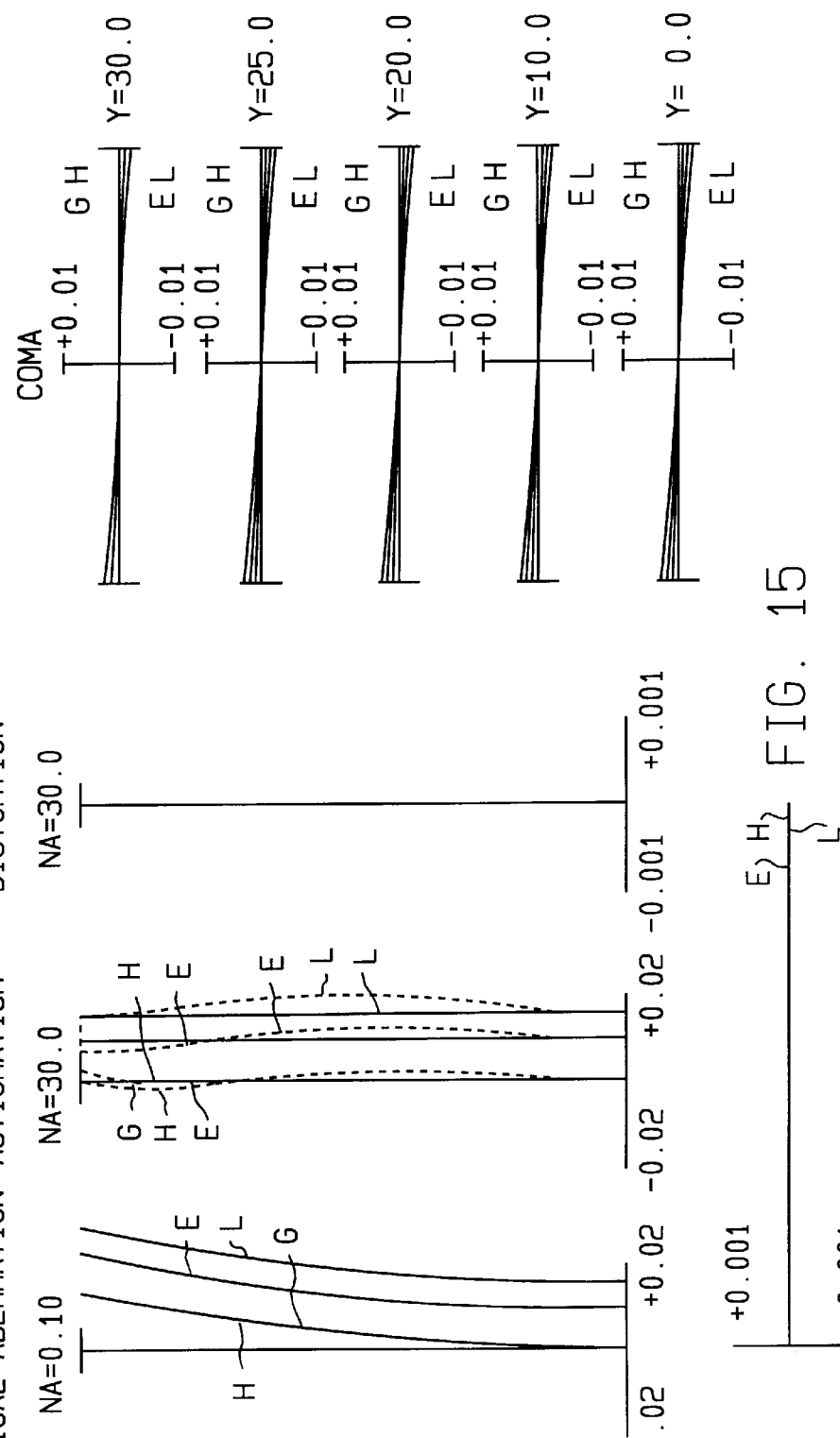

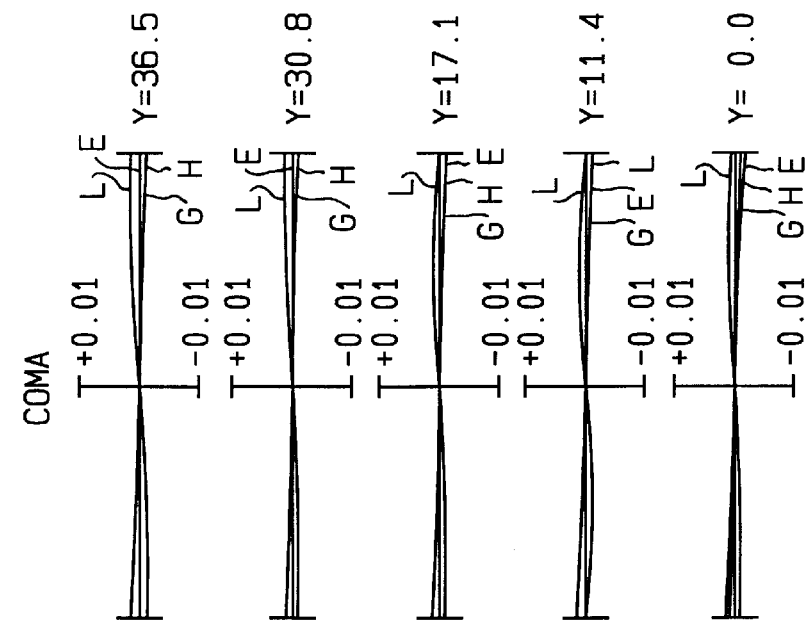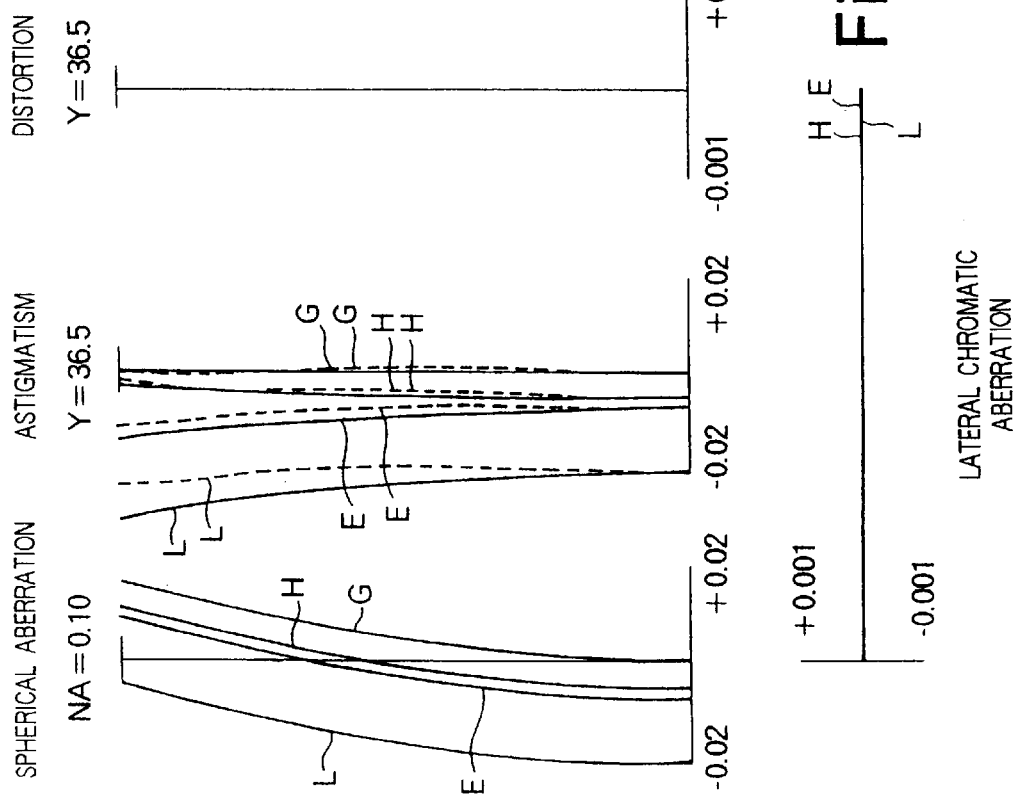

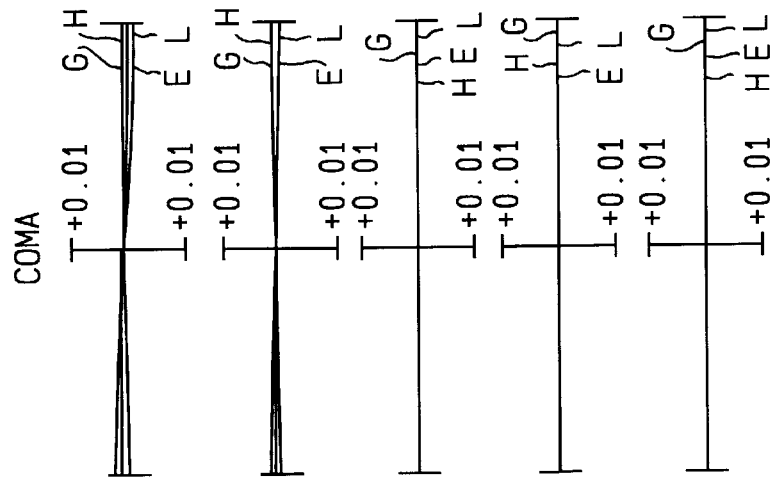
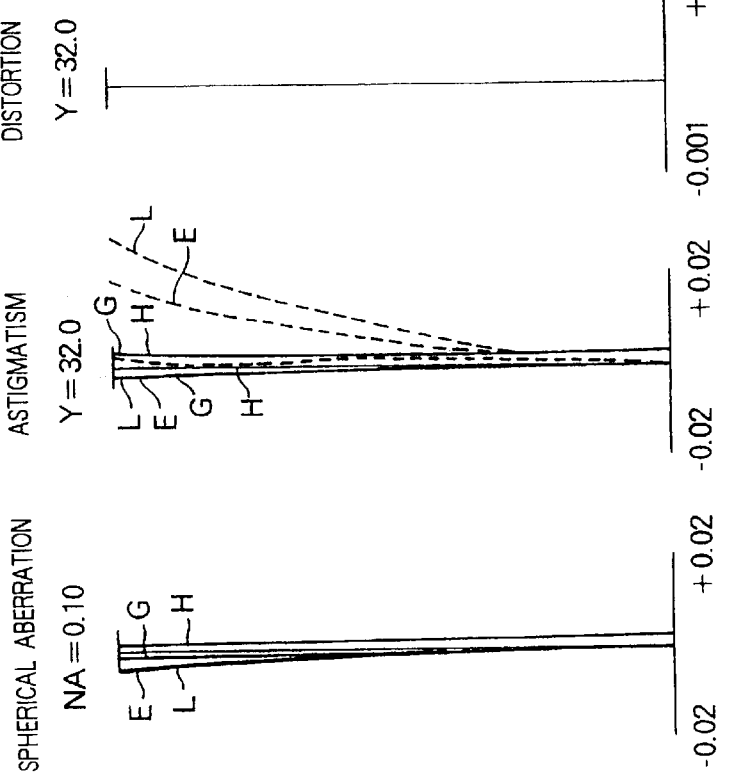
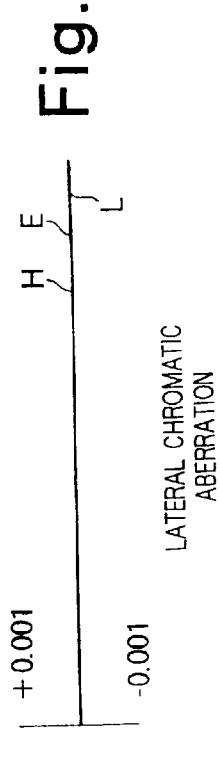

PROJECTION EXPOSURE APPARATUS

BACKGROUND OF THE INVENTION

1. Field of the Invention

The present invention relates to a projection exposure apparatus for projection-transferring a pattern on a first object onto a second object, and more particularly to a projection exposure apparatus using a catadioptric optical system as a projection optical system.

2. Related Background Art

A Dyson optical system, for example as disclosed in the national publication of translated version of Japanese Patent Application No. 58-500730 or U.S. Pat. No. 4,171,871, is known as an optical system for forming a real-size (unit-magnification) image of the pattern formed on the first object (for example, a mask, a reticle, etc.) onto the second object (for example, a wafer, a glass plate, etc.) by the technique of photolithography. Here, the Dyson optical system as disclosed in the national publication of translated version of Japanese Patent Application No. 58-500730 was composed of a path-folding prism, a plano-convex lens cemented to the prism, a negative meniscus lens cemented to the plano-convex lens, and a concave mirror opposed to the negative meniscus lens.

Further, the Dyson optical system as disclosed in U.S. Pat. No. 4,171,871 was composed of a path-folding prism, a plano-convex lens, a cemented lens consisting of a negative meniscus lens and a meniscus lens, a meniscus lens with a concave surface opposed to the cemented lens side, and a meniscus Mangin mirror cemented to the meniscus lens.

SUMMARY OF THE INVENTION

A projection exposure apparatus according to the present invention is one for projection-printing a real-size image of a first object on a second object, and has a projection optical system having the optical axis not intersecting with the first and second objects and disposed between the first object and the second object. The projection optical system has a cemented lens consisting of a plano-convex lens and a first negative meniscus lens with a concave surface opposed to the plano-convex lens side, a second negative meniscus lens arranged with an air space with respect to the cemented lens and with a concave surface opposed to the cemented lens side, a concave mirror arranged with an air space with respect to the second negative meniscus lens and with a concave surface opposed to the second negative meniscus lens side, and a path-folding prism for guiding light from the first object to the plano-convex lens and also guiding light coming through the plano-convex lens from the concave mirror onto the second object. The cemented lens, the second negative meniscus lens, and the concave mirror are arranged along the optical axis. The first and second negative meniscus lenses satisfy the following condition:

$$-0.36 < \Psi b/\Psi a < 0 \quad (1)$$

where $\Psi a$ is a refractive power of the plano-convex lens and $\Psi b$ a refractive power of the first or second negative meniscus lens. When an Abbe number of a glass material for the first or second negative meniscus lens is $v$, a glass material for one of the first and second negative meniscus lenses satisfies the condition of $v<45$ while a glass material for the other negative meniscus lens satisfies the condition of $v>45$.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 7 to 11 are aberration diagrams to show aberrations of the optical system in the first embodiment;

FIGS. 12 to 16 are aberration diagrams to show aberrations of the optical system in the second embodiment;

FIGS. 17 to 21 are aberration diagrams to show aberrations of the optical system in the third embodiment; and FIGS. 22 to 26 are aberration diagrams to show aberrations of the optical system in the fourth embodiment.

DESCRIPTION OF THE PREFERRED EMBODIMENTS

Figure 1:
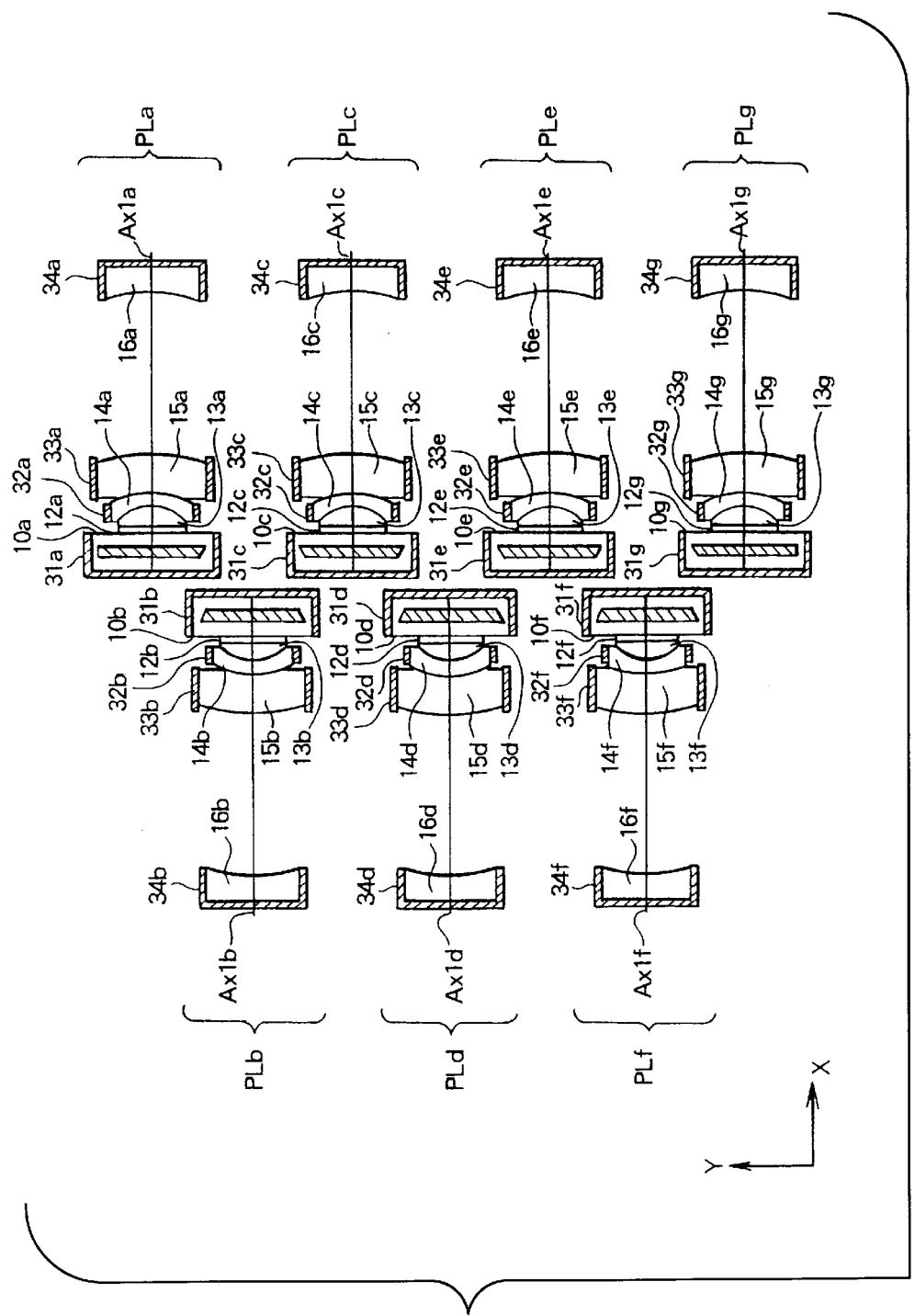
FIG. 1 is a plan view to show the schematic structure of a projection exposure apparatus according to the present invention.

The conventional Dyson optical systems as described previously are constructed with a very short working distance, which is the space between the first or second object and the most-object-side surface of Dyson optical system.

Recently, a pellicle film comprised of a transparent thin film is often used on a pellicle holding member, which is a frame provided around the pattern, on the first object in order to prevent a foreign substance attached to the pattern formed on the surface of the first object from being transcribed onto the second object.

However, in the cases of the conventional Dyson optical systems having such short working distances, there is a possibility that the projection optical system itself interferes with the above pellicle holding member or pellicle film. It also becomes difficult to set an AF detection system for detecting a space between the first object and the second object.

In the present invention, the suitable range of refractive powers of the first and second negative meniscus lenses is defined as expressed by the above, condition of Equation (1) in order to achieve good imaging performance based on correction for aberrations, particularly correction for chromatic aberration, while securing a sufficient working distance. This condition of Equation (1) is a condition for achieving good correction for aberrations, particularly good correction for chromatic aberration, when the Abbe number ν of the glass material for one of the first and second negative meniscus lenses is determined as ν<45 and the Abbe number of the glass material for the other negative meniscus lens as ν>45.

Here, below the lower limit of the condition of Equation (1), the refractive power of at least one of the first and second negative meniscus lenses becomes negatively strong, which will result in insufficient correction for chromatic aberration, which is thus not preferred. Above the upper limit of the condition of Equation (1), correction for chromatic aberration becomes excessive, thus not preferred. Further, when the Abbe number ν of the glass material for the one negative meniscus lens is determined as ν<45 while the Abbe number ν of the glass material for the other negative meniscus lens as ν>45, and if the refractive powers are determined departing from the range of the condition of Equation (1), it becomes difficult to correct for astigmatism and curvature of field without increasing the number of lens elements composing the projection optical system, which is thus not preferred.

In the present invention, an Abbe number ν of a glass material is expressed by the following equation:

$$\nu = (n_d - 1)/(n_F - n_c)$$

where $n_d$ is a refractive index of the glass material for the d-line (587.6 nm), $n_F$ a refractive index of the glass material for the F-line (486.1 nm), and $n_c$ a refractive index of the glass material for the c-line (656.3 nm).

In the present invention, a preferred arrangement is that a meniscus correcting lens is disposed between the second meniscus lens and the concave mirror. This meniscus correcting lens is desired to be constructed to satisfy the following condition:

$$D < 0.3r \quad (2)$$

where D is a distance between the concave mirror and the meniscus correcting lens and r is an absolute value of a radius of curvature of the concave mirror.

This meniscus correcting lens is a lens having a meniscus shape and a weak refractive power, which has a function to correct for spherical aberration mainly appearing in extending the working distance (a space between the path-folding prism and the object plane or the image plane). Here, if the meniscus correcting lens should be out of the range of the above condition of Equation (2), the space between the meniscus correcting lens and the concave mirror would be too wide, resulting in being incapable of correcting for spherical aberration and causing other aberrations, which is thus not preferred.

In the present invention, the following condition is also desired to be satisfied:

$$wd/r \geq 0.013 \quad (3)$$

where r is the radius of curvature of the concave mirror and wd is the above working distance.

Here, the working distance wd becomes short outside the range of the condition of Equation (3), which is not preferred in terms of arrangement of apparatus. If there exists an air space between the path-folding prism and the plano-convex lens, the working distance wd is a sum of the air space and the distance between the path-folding prism and the object plane or the image plane.

Figure 2:
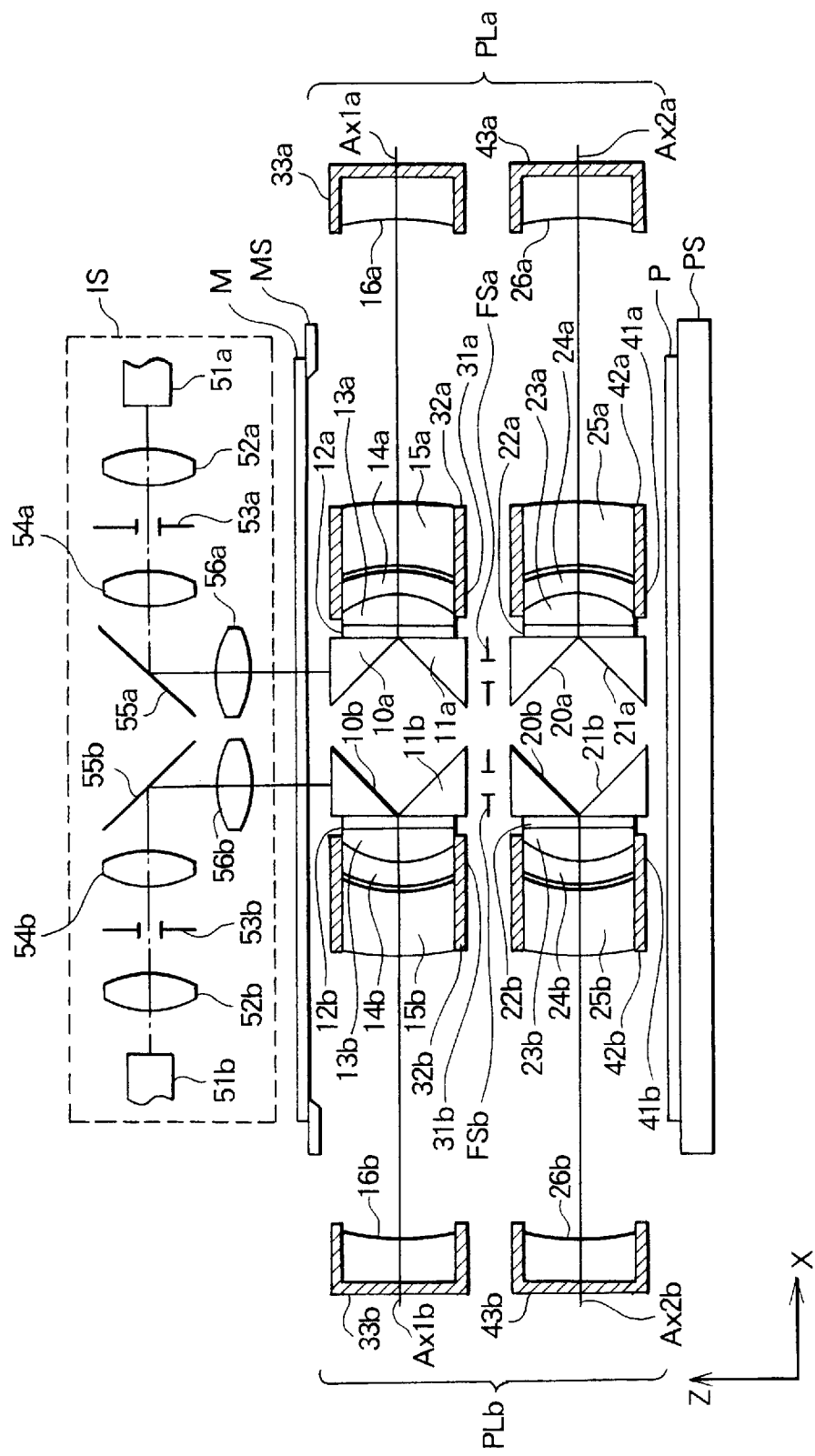
FIG. 2 is a side sectional view to show the schematic structure of the projection exposure apparatus according to the present invention.

Embodiments according to the present invention will be explained by reference to the drawings. FIG. 1 and FIG. 2 are an XY plan view and an XZ sectional view, respectively, to show an example of the projection exposure apparatus according to the present invention.

The projection exposure apparatus of the present embodiment has seven sets of projection optical units PLa–PLg, for example as shown in FIG. 1.

Further, the projection exposure apparatus of the present embodiment has, as shown in FIG. 2, a mask stage MS on which a mask M with a predetermined circuit pattern formed thereon is mounted and which is arranged as movable along the X-direction in the drawing, and a plate stage PS on which a plate P comprised of a glass substrate is mounted and which is arranged as movable along the X-direction in the drawing. Between these mask stage MS and plate stage PS there are the projection optical units PLa–PLg each composed of two Dyson optical systems. The projection optical units PLa–PLg each have the same structure. It is noted here that FIG. 2 shows only the projection optical units PLa, PLb. Here, the projection optical unit PLa–PLg forms a real-size erect image (which is an image formed at the lateral magnification of +1 both in the X and Y directions) of mask M on the plate P.

An illumination optical apparatus IS for supplying exposure light is provided on the opposite side of the projection optical units PLa, PLb to the mask M. In FIG. 2, the illumination optical system IS has optical integrators 51a, 51b for forming secondary light sources, condenser lenses 52a, 52b for condensing light from the optical integrators 51a, 51b, field stops 53a, 53b disposed at respective focus positions of the condenser lenses 52a, 52b, relay lens systems 54a, 56a, 54b, 56b for forming images of the field stops 53a, 53b on the mask M, and path-folding mirrors 55a, 55b disposed in the corresponding relay lens systems. FIG. 2 is illustrated as omitting members disposed in the optical paths of from light sources to the optical integrators 51a, 51b. Such an illumination optical system IS may be one of those proposed in the bulletins of Japanese Patent Applications No. 5-161588 and No. 6-170087 as filed by the assignee of the present application.

Returning to FIG. 1, the illumination optical apparatus IS illuminates the inside of nearly trapezoid areas on the mask M, as shown by hatching in the drawing. These areas on the mask M are transferred as real-size erect images onto the plate P by the respective projection optical units PLa–PLg.

The projection optical units PLa–PLg are next explained referring to FIG. 1 and FIG. 2, but only the constitution of the projection optical unit PLa is explained herein, because these projection optical units PLa–PLg have the same constitution.

The projection optical unit PLa is provided with a first optical system for forming a real-size inverted image of the mask M on a field stop FSa and a second optical system for forming a real-size erect image of the mask M on the plate P. The first optical system has path-folding prisms 10a, 11a, a plane-parallel plate 12a cemented to the path-folding prisms 10a, 11a, a plano-convex lens 13a, a negative meniscus lens 14a cemented to the plano-convex lens 13a, a negative meniscus lens 15a arranged with an air space with respect to the negative meniscus lens 14a, and a concave mirror 16a as being a front-surface mirror. The second optical system has path-folding prisms 20a, 21a, a plane-parallel plate 22a cemented to the path-folding prisms 20a, 21a, a plano-convex lens 23a, a negative meniscus lens 24a cemented to the plano-convex lens 23a, a negative meniscus lens 25a arranged with an air space with respect to the negative meniscus lens 24a, and a concave mirror 26a as being a front-surface mirror.

In this arrangement, the plano-convex lens 13a, negative meniscus lenses 14a, 15a, and concave mirror 16a are arranged along the optical axis Ax1a extending along the X-direction, while the plano-convex lens 23a, negative meniscus lenses 24a, 25a, and concave mirror 26a are arranged along the optical axis Ax2a extending along the X-direction. Namely, each of the optical axes Ax1a, Ax2a of the first and second optical systems is arranged to intersect with neither the mask M nor the plate P, and thus, is parallel with the circuit-pattern-formed surface of mask M and the image-formed surface of plate P.

Here is briefly explained the optical path. Exposure light from the illumination optical system through the mask M advances in order through the path-folding prism 10a, plane-parallel plate 12a, plano-convex lens 13a, negative meniscus lens 14a, and negative meniscus lens 15a, then is reflected by the concave mirror 16a, advances in order through the negative meniscus lens 15a, negative meniscus lens 14a, plano-convex lens 13a, plane-parallel plate 12a, and path-folding prism 11a, and then reaches the field stop FSa. Light from the field stop FSa then advances in order through the path-folding prism 20a, plane-parallel plate 22a, plano-convex lens 23a, negative meniscus lens 24a, and negative meniscus lens 25a, then is reflected by the concave mirror 26a, advances in order through the negative meniscus lens 25a, negative meniscus lens 24a, plano-convex lens 23a, plane-parallel plate 22a, and path-folding prism 21a, and then reaches the plate P.

Returning to FIG. 1, a prism holding member 31a unitarily holds the path-folding prisms 10a, 11a and the plane-parallel plate 12a cemented to these path-folding prisms, and a lens holding member 32a holds the cemented lens consisting of the plano-convex lens 13a and negative meniscus lens 14a. Further, a lens holding member 33a holds the negative meniscus lens 15a, and a concave mirror holding member 34a holds the concave mirror 16a.

Although not shown in FIG. 1 and FIG. 2, the prism holding member 31a is arranged as rotatable about an axis parallel to the Z-axis relative to the main body of projection exposure apparatus, and rotation of the prism holding member 31a can correct a rotational position deviation of the image of mask M formed on the plate P. This correction of rotational position deviation is proposed in the bulletin of Japanese Patent Application No. 6-329962 filed by the assignee of the present application. Another acceptable arrangement is such that the prism holding member 31a is fixed to the main body of projection exposure apparatus and the lens holding members 32a, 33a and the concave mirror holding member 34a are arranged as rotatable about the axis parallel to the Z-axis relative to the main body of exposure apparatus.

The lens holding members 32a, 33a and the concave mirror holding member 34a are arranged so that a space along the optical axis Ax1a between them can be changed. This can compensate for degradation of imaging performance due to a production error. Further, the lens holding members 32a, 33a and the concave mirror holding member 34a are arranged as finely movable along directions (the Y and Z directions) perpendicular to the optical axis Ax1a. This can correct for asymmetric aberration due to a production error.

Now, explained referring to FIG. 3 to FIG. 26 are numerical examples of the projection optical system, which can be applied to the projection exposure apparatus according to the present invention.

Figure 3:
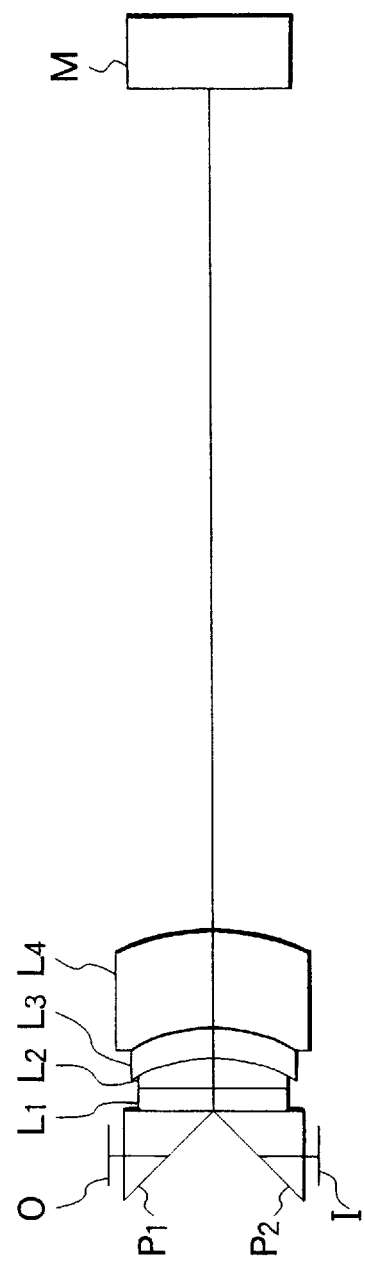
FIG. 3 is a drawing to show a lens layout of the first embodiment according to the present invention.

FIG. 3 is a drawing to show a lens layout of a projection optical system according to the first embodiment. The projection optical system of the first embodiment is next explained referring to FIG. 3.

In FIG. 3, the projection optical system of the first embodiment has a plane-parallel plate $L_1$, a cemented lens component consisting of a plano-convex lens $L_2$ and a negative meniscus lens $L_3$ with a concave surface opposed to the side of the plano-convex lens $L_2$, a negative meniscus lens $L_4$ with a concave surface opposed to the cemented lens component side, a concave mirror M having a concave reflecting surface on the side of the negative meniscus lens $L_4$, and path-folding prisms $P_1$, $P_2$ bonded to the plane-parallel plate $L_1$. Here, light from the object plane O is reflected approximately 90° by the path-folding prism $P_1$, then advances in order through the plane-parallel plate $L_1$, plano-convex lens $L_2$, negative meniscus lens $L_3$, and negative meniscus lens $L_4$, and then reaches the concave mirror M. Light reflected by the concave mirror M advances in order through the negative meniscus lens $L_4$, negative meniscus lens $L_3$, plano-convex lens $L_2$, and plane-parallel plate $L_1$, and then is reflected 90° by the path-folding prism $P_2$ to reach the image plane I. A real-size image of the object plane O is formed on the image plane I.

Figure 4:
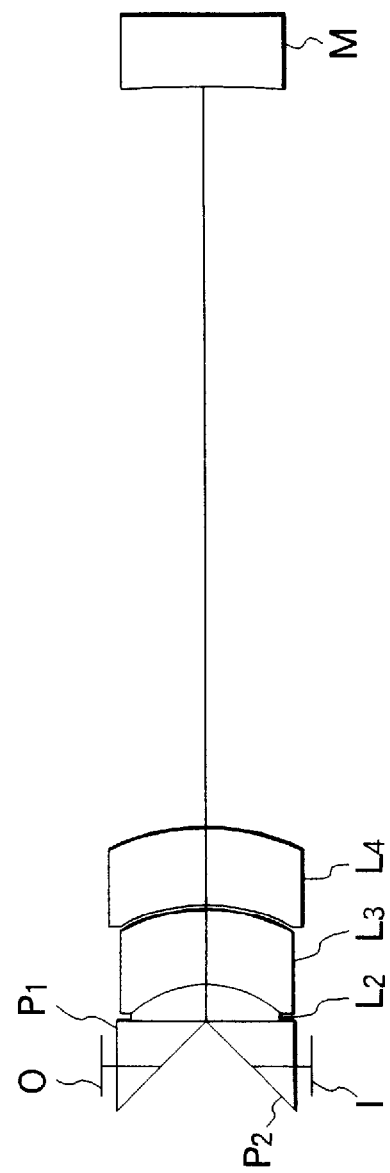
FIG. 4 is a drawing to show a lens layout of the second embodiment according to the present invention.

Next, FIG. 4 is a drawing to show a lens layout of a projection optical system according to the second embodiment. The layout of the projection optical system of the second embodiment is next explained referring to FIG. 4.

In FIG. 4, the projection optical system of the second embodiment has a cemented lens component consisting of a plano-convex lens $L_2$ and a negative meniscus lens $L_3$ with a concave surface opposed to the side of the plano-convex lens $L_2$, a negative meniscus lens $L_4$ with a concave surface opposed to the cemented lens component side, a concave mirror M having a concave reflecting surface on the side of the negative meniscus lens component $L_4$, and path-folding prisms $P_1$, $P_2$ cemented to the plano-convex lens $L_2$. In the present embodiment, light from the object plane O is reflected approximately 90° by the path-folding prism $P_1$, thereafter advances in order through the plano-convex lens $L_2$, negative meniscus lens $L_3$, and negative meniscus lens $L_4$, and then reaches the concave mirror M. Light reflected by the concave mirror M advances in order through the negative meniscus lens $L_4$, negative meniscus lens $L_3$, and plano-convex lens $L_2$, and is reflected 90° by the path-folding prism $P_2$ to reach the image plane I. A real-size image of the object plane O is formed on the image plane I.

Figure 5:
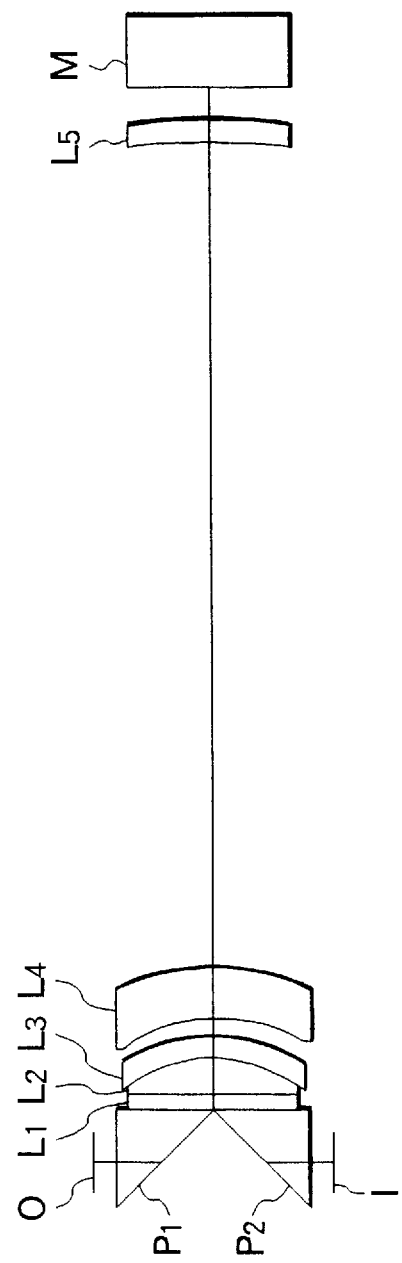
FIG. 5 is a drawing to show a lens layout of the third embodiment according to the present invention.

Another projection optical system according to the third embodiment is next explained referring to FIG. 5. FIG. 5 is a drawing to show a lens layout of the projection optical system of the third embodiment.

In FIG. 5, the projection optical system of the third embodiment has a plane-parallel plate $L_1$, a cemented lens component consisting of a plano-convex lens $L_2$ and a negative meniscus lens $L_3$ with a concave surface opposed to the side of the plano-convex lens $L_2$, a negative meniscus lens $L_4$ with a concave surface opposed to the cemented lens component side, a concave mirror M having a concave reflecting surface on the side of the negative meniscus lens $L_4$, and path-folding prisms $P_1$, $P_2$ cemented to the plane-parallel plate $L_1$. In the present embodiment, a lens $L_5$ of a meniscus shape with a concave surface opposed to the side of the negative meniscus lens $L_4$ is disposed as a meniscus correcting lens in the optical path between the concave mirror M and the negative meniscus lens $L_4$. In the present embodiment, light from the object plane O is reflected approximately 90° by the path-folding prism $P_1$, thereafter advances in order through the plane-parallel plate $L_1$, plano-convex lens $L_2$, negative meniscus lens $L_3$, negative meniscus lens $L_4$, and lens $L_5$, and then reaches the concave mirror M. Light reflected by the concave mirror M advances in order through the lens $L_5$, negative meniscus lens $L_4$, negative meniscus lens $L_3$, plano-convex lens $L_2$, and plane-parallel plate $L_1$, and then is reflected 90° by the path-folding prism $P_2$ to reach the image plane I. A real-size image of the object plane O is formed on the image plane I.

Figure 6:
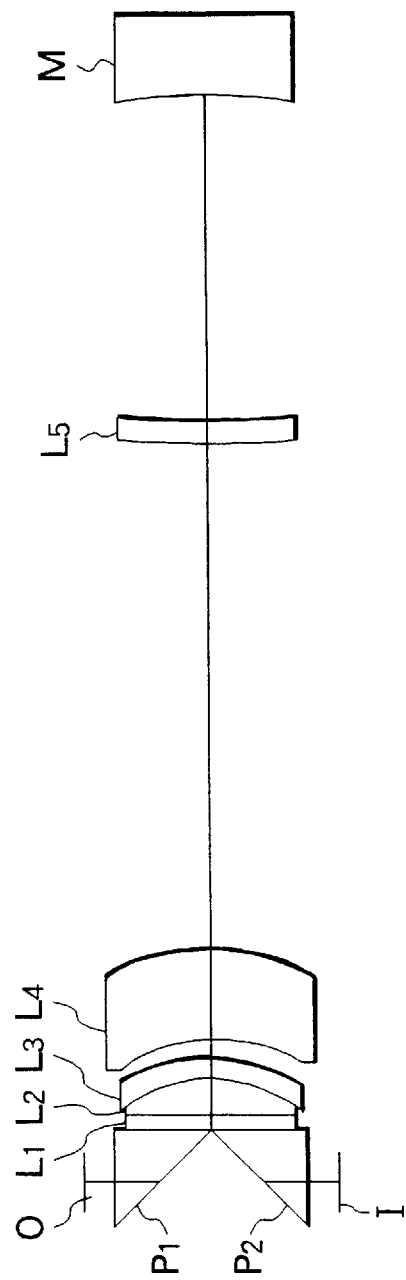
FIG. 6 is a drawing to show a lens layout of the fourth embodiment according to the present invention.

Another projection optical system according to the fourth embodiment is next explained referring to FIG. 6. FIG. 6 is a drawing to show a lens layout of the projection optical system of the fourth embodiment.

In FIG. 6, the projection optical system of the fourth embodiment has the layout similar to that of the above third embodiment, but is different in that the lens $L_5$ disposed between the concave mirror M and the negative meniscus lens $L_4$ is constructed in a meniscus shape with a concave surface opposed to the side of the concave mirror M.

There are listed refractive indices $n_g$ and Abbe numbers $\nu$ for the g-line in Table 1 and values of specifications and correspondent values to the conditions for the respective embodiments according to the present invention in Table 2 to Table 5.

In Tables 2 to 5, left-end numerals represent orders from the side of the object plane O (first surface side) toward the concave mirror M, R radii of curvature of lens surfaces, D surface separations between lens surfaces, and element numbers do reference symbols of the respective lenses in FIG. 3 to FIG. 6. Table 1 below includes refractive indices $n_g$ of the glass materials described in Table 2 to Table 5 at the g-line (435.8 nm), and Abbe numbers $\nu$ expressed by $\nu=(n_d-1)/(n_F-n_c)$ where $n_d$ is a refractive index of glass material for the d-line (587.6 nm), $n_F$ a refractive index of glass material for the F-line (486.1 nm), and $n_c$ is a refractive index of glass material for the c-line (656.3 nm).

TABLE 1

| Glass Material | ng | $\nu$ |
|---|---|---|
| SK5 | 1.60101 | 61.2 |
| LaK8 | 1.72940 | 53.9 |
| F2 | 1.64430 | 36.3 |
| BK7 | 1.52667 | 64.2 |
| Silica Glass | 1.46674 | |

Since the projection optical systems of the present invention are perfectly symmetric optical systems with respect to the concave mirror M, Tables 2 to 5 include only values of specifications of from the side of the object plane O to the concave mirror M.

In Table 2 to Table 5, y represents the image height, NA the numerical aperture of projection optical system, wd a space between the object plane O and the surface of the path-bending prism $P_1$ on the side of the object plane O (working distance), $\Psi a$ a refractive power of the plano-convex lens $L_2$, $\Psi b$ refractive powers of the first and second negative meniscus lenses $L_3$, $L_4$, r a radius of curvature of the concave mirror M, and d a distance between the concave mirror M and the meniscus correcting lens $L_5$.

TABLE 2

[First Embodiment]
2y = 62 mm
NA = 0.1
wd = 6.20

| | R | D | Glass Material | Element Number |
|---|---|---|---|---|
| 1 | ∞ | 41.30 | SK5 | P1 (P2) |
| 2 | ∞ | 8.00 | Silica | L1 |
| 3 | ∞ | 0.30 | | |
| 4 | ∞ | 14.00 | Silica | L2 |
| 5 | −65.02 | 11.80 | LaK8 | L3 |
| 6 | −79.86 | 1.30 | | |
| 7 | −79.41 | 43.08 | F2 | L4 |
| 8 | −120.57 | 373.41 | | |
| 9 | −500.00 | | | M |

[Correspondent Values of 1st Embodiment to the Conditions]
$\psi b/\psi a = -0.194$ (L3/L2)
$\psi b/\psi a = -0.227$ (L4/L2)
$\upsilon = 53.8$ (L3)
$\upsilon = 36.2$ (L4)
wd/r = 0.0130

TABLE 3

[Second Embodiment]
2y = 60 mm
NA = 0.1
wd = 6.00

| | R | D | Glass Material | Element Number |
|---|---|---|---|---|
| 1 | ∞ | 40.00 | LaK8 | P1 (P2) |
| 2 | ∞ | 15.50 | BK7 | L1 |
| 3 | −54.27 | 32.65 | F2 | L2 |
| 4 | −77.46 | 2.00 | | |
| 5 | −78.69 | 34.23 | LaK8 | L3 |
| 6 | −124.94 | 323.54 | | |
| 7 | −452.00 | | | M |

[Correspondent Values of 2nd Embodiment to the Conditions]
$\psi b/\psi a = -0.164$ (L2/L1)
$\psi b/\psi a = -0.245$ (L3/L1)
$\upsilon = 36.2$ (L2)
$\upsilon = 53.8$ (L3)
wd/r = 0.0133

TABLE 4

[Third Embodiment]
2y = 73 mm
NA = 0.1
wd = 11.41

| | R | D | Glass Material | Element Number |
|---|---|---|---|---|
| 1 | ∞ | 49.39 | SK5 | P1 (P2) |
| 2 | ∞ | 7.98 | Silica | L1 |
| 3 | ∞ | 0.34 | | |
| 4 | ∞ | 16.54 | Silica | L2 |
| 5 | −76.02 | 10.27 | LaK8 | L3 |
| 6 | −98.30 | 8.21 | | |
| 7 | −98.07 | 27.21 | F2 | L4 |
| 8 | −138.44 | 408.88 | | |
| 9 | −339.60 | 11.41 | LaK8 | L5 |
| 10 | −342.27 | 14.29 | | |
| 11 | −570.31 | | | M |

[Correspondent Values of 3rd Embodiment to the Conditions]
$\psi b/\psi a = -0.288$ (L3/L2)
$\psi b/\psi a = -0.229$ (L4/L2)

TABLE 4-continued

υ = 53.8 (L3)
υ = 36.2 (L4)
D = 14.29
r = 570.31
wd/r = 0.0206

TABLE 5

[Fourth Embodiment]
2y = 64 mm
NA = 0.1
wd = 13.00

| | R | D | Glass Material | Element Number |
|---|---|---|---|---|
| 1 | ∞ | 43.30 | SK5 | P1 (P2) |
| 2 | ∞ | 7.00 | Silica | L1 |
| 3 | ∞ | 0.30 | | |
| 4 | ∞ | 14.50 | Silica | L2 |
| 5 | −68.58 | 9.00 | LaK8 | L3 |
| 6 | −93.81 | 7.20 | | |
| 7 | −92.62 | 36.83 | F2 | L4 |
| 8 | −120.75 | 224.94 | | |
| 9 | 600.00 | 10.00 | LaK8 | L5 |
| 10 | 599.06 | 140.00 | | |
| 11 | −500.00 | | | M |

[Correspondent Values of 4th embodiment to the Conditions]
ψb/ψa = −0.354 (L3/L2)
ψb/ψa = −0.116 (L4/L2)
υ = 53.8 (L3)
υ = 36.2 (L4)
D = 140.00
r = 500.00
wd/r = 0.0266

As described above, it is seen that the projection optical system of each embodiment as detailed above secures a sufficient working distance wd while achieving a relatively wide exposure area.

FIGS. 7–11, FIGS. 12–16, FIGS. 17–21, and FIGS. 22–26 are aberration diagrams to show aberrations in the first to the fourth embodiments, respectively, according to the present invention.

In each aberration diagram, NA indicates the numerical aperture of projection optical system, Y the image height, G the g-line (436 nm), H the h-line (405 nm), E the e-line (546 nm), and L 633 nm which is the wavelength of the He—Ne laser. In each astigmatism diagram, the dotted line represents the meridional image surface and the solid line the sagittal image surface.

From comparison of the aberration diagrams, it is understood that each embodiment is well corrected for aberrations in a good balance, particularly that chromatic aberration is corrected extremely well over the wide band.

Since the projection optical system of each embodiment as described above uses glass materials with high transmittance in the exposure wavelength region, it can enjoy excellent advantages of decreasing losses of exposure light and decreasing illumination variations of imaging performance (changes of optical performance due to changes of properties when the glass material absorbs the exposure light).

FIG. 1 and FIG. 2 show the projection exposure apparatus having a plurality of projection optical units constructed of a combination of the projection optical systems as exemplified in the numerical examples, but the present invention may be applied to projection exposure apparatus having a single projection optical unit of such a type or to projection exposure apparatus having only one projection optical system as exemplified in the numerical examples.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 015609/1995 (7-015609) filed on Feb. 2, 1995, is hereby incorporated by reference.

What is claimed is:

1. A projection exposure apparatus for projection-transferring a substantially real-size image of a pattern on a first object onto a second object, comprising:

an illumination optical system for supplying light to said first object;

a first stage for supporting said first object;

a second stage for supporting said second object; and a projection optical system having an optical axis substantially parallel to a surface on said first object on which said pattern is provided and a surface on said second object on which said image is formed, said projection optical system being disposed between said first and second objects and making a position of said first object supported by said first stage conjugate with a position of said second object supported by said second stage, wherein said projection optical system comprises:

a cemented lens consisting of a plano-convex lens and a first negative meniscus lens with a concave surface opposed to said plano-convex lens, said cemented lens being disposed along said optical axis;

a second negative meniscus lens with a concave surface opposed to said cemented lens, said second negative meniscus lens being disposed along said optical axis with an air space with respect to said cemented lens;

a concave mirror with a concave reflecting surface opposed to said second negative meniscus lens, said concave mirror being disposed along said optical axis with an air space with respect to said second negative meniscus lens; and a prism for guiding light from said first object to said plano-convex lens and for guiding light reflected by said concave mirror and then passing through said plano-convex lens to said second object, wherein the following conditions all are satisfied:

$$-0.36 < \Psi_{b1}/\Psi_a < 0$$

$$-0.36 < \Psi_{b2}/\Psi_a < 0$$

where $\Psi_a$ is a refractive power of said plano-convex lens, $\Psi_{b1}$ a refractive power of said first negative meniscus lens, and $\Psi_{b2}$ a refractive power of said second negative meniscus lens, and wherein said first and second negative meniscus lenses are each comprised of a glass material, and wherein the glass material for one of said first and second negative meniscus lenses has an Abbe number smaller than 45 and the glass material for the other negative meniscus lens has an Abbe number larger than 45.

2. The projection exposure apparatus according to claim 1, wherein said projection optical system further comprises a meniscus correcting lens disposed between said second negative meniscus lens and said concave mirror, and wherein the following condition is satisfied:

$$D < 0.3r$$

where D is a distance between said concave mirror and said meniscus correcting lens and r is an absolute value of a radius of curvature of said concave reflecting surface of said concave mirror.

3. The projection exposure apparatus according to claim 1, wherein said projection optical system further comprises a plane-parallel plate disposed between said plano-convex lens and said prism.

4. The projection exposure apparatus according to claim 1, wherein the following conditions all are satisfied:

$$wd_1/r \geq 0.013$$

$$wd_2/r \geq 0.013$$

where r is a radius of curvature of said concave reflecting surface of said concave mirror, $wd_1$ a distance between said first object and said prism, and $wd_2$ a distance between said second object and said prism.

5. The projection exposure apparatus according to claim 1, wherein a plurality of said projection optical systems are arranged along the surface where the image is formed on said second object, and wherein light from the pattern on said first object is split into a plurality of beams, which advance through the plurality of corresponding said projection optical systems to reach the surface on said second object.

6. A projection exposure apparatus for projection-transferring a substantially real-size image of a pattern on a first object onto a second object, comprising:

an illumination optical system for supplying light to said first object;
a first stage for supporting said first object;
a second stage for supporting said second object;
a first projection optical system having a first optical axis substantially parallel to a surface on said first object on which said pattern is provided and a surface on said second object on which said image is formed, said first projection optical system being disposed between said first and second objects and forming an intermediate image, based on light from said first object; and
a second projection optical system having a second optical axis substantially parallel to the surface on said first object on which said pattern is provided and the surface on said second object on which said image is formed, said second projection optical system being disposed between said first projection optical system and said second object and forming an image on said second object, based on light from said intermediate image,
wherein said first projection optical system comprises:
a first cemented lens consisting of a first plano-convex lens and a first negative meniscus lens with a concave surface opposed to said first plano-convex lens, said first cemented lens being disposed along said first optical axis;
a second negative meniscus lens with a concave surface opposed to said first cemented lens, said second negative meniscus lens being disposed along said first optical axis with an air space with respect to said first cemented lens;
a first concave mirror with a concave reflecting surface opposed to said second negative meniscus lens, said first concave mirror being disposed along said first optical axis with an air space with respect to said second negative meniscus lens; and
a first prism for guiding light from said first object to said first plano-convex lens and for guiding light reflected by said first concave mirror and then passing through said first plano-convex lens to said intermediate image,
wherein said second projection optical system comprises:
a second cemented lens consisting of a second plano-convex lens and a third negative meniscus lens with a concave surface opposed to said second plano-convex lens, said second cemented lens being disposed along said second optical axis;
a fourth negative meniscus lens with a concave surface opposed to said second cemented lens, said fourth negative meniscus lens being disposed along said second optical axis with an air space with respect to said second cemented lens;
a second concave mirror with a concave reflecting surface opposed to said fourth negative meniscus lens, said second concave mirror being disposed along said second optical axis with an air space with respect to said fourth negative meniscus lens; and
a second prism for guiding light from said intermediate image to said second plano-convex lens and for guiding light reflected by said second concave mirror and then passing through said second plano-convex lens to said second object,
wherein the following conditions all are satisfied:

$$-0.36 < \Psi_{b1}/\Psi_{a1} < 0$$

$$-0.36 < \Psi_{b2}/\Psi_{a1} < 0$$

where $\Psi_{a1}$ is a refractive power of said first plano-convex lens, $\Psi_{b1}$ a refractive power of said first negative meniscus lens, and $\Psi_{b2}$ a refractive power of said second negative meniscus lens,
wherein the following conditions all are satisfied:

$$-0.36 < \Psi_{b3}/\Psi_{a2} < 0$$

$$-0.36 < \Psi_{b4}/\Psi_{a2} < 0$$

where $\Psi_{a2}$ is a refractive power of said second plano-convex lens, $\Psi_{b3}$ a refractive power of said third negative meniscus lens, and $\Psi_{b4}$ a refractive power of said fourth negative meniscus lens,
wherein said first and second negative meniscus lenses are each comprised of a glass material, and wherein the glass material for one of said first and second negative meniscus lenses has an Abbe number smaller than 45 while the glass material for the other negative meniscus lens has an Abbe number larger than 45, and
wherein said third and fourth negative meniscus lenses are each comprised of a glass material, and wherein the glass material for one of said third and fourth negative meniscus lenses has an Abbe number smaller than 45 while the glass material for the other negative meniscus lens has an Abbe number larger than 45.

7. The projection exposure apparatus according to claim 6, wherein said first projection optical system further comprises a first meniscus correcting lens disposed between said second negative meniscus lens and said first concave mirror,
wherein said second projection optical system further comprises a second meniscus correcting lens disposed between said fourth negative meniscus lens and said second concave mirror,
wherein the following condition is satisfied:

$$D_1 < 0.3 r_1$$

where $D_1$ is a distance between said first concave mirror and said first meniscus correcting lens and $r_1$ an absolute value of a radius of curvature of said concave reflecting surface of said first concave mirror, and wherein the following condition is satisfied:

$$D_2 < 0.3 r_2$$

where $D_2$ is a distance between said second concave mirror and said second meniscus correcting lens and $r_2$ an absolute value of a radius of curvature of said concave reflecting surface of said second concave mirror.

8. The projection exposure apparatus according to claim 6, wherein said first projection optical system further comprises a first plane-parallel plate between said first plano-convex lens and said first prism, and wherein said second projection optical system further comprises a second plane-parallel plate between said second plano-convex lens and said second prism.

9. The projection exposure apparatus according to claim 6, further comprising a field stop disposed at a position of said intermediate image.

10. The projection exposure apparatus according to claim 6, wherein the following conditions all are satisfied:

$$wd_1/r_1 \geq 0.013$$

$$wd_2/r_1 \geq 0.013$$

where $r_1$ is a radius of curvature of said concave reflecting surface of said first concave mirror, $wd_1$ a distance between said first object and said first prism, and $wd_2$ a distance between said second object and said first prism, and wherein the following conditions all are satisfied:

$$wd_3/r_2 \geq 0.013$$

$$wd_4/r_2 \geq 0.013$$

where $r_2$ is a radius of curvature of said concave reflecting surface of said second concave mirror, $wd_3$ a distance between said first object and said second prism, and $wd_4$ a distance between said second object and said second prism.

11. The projection exposure apparatus according to claim 6, wherein a plurality of projection optical units each composed of said first and second projection optical systems are arranged along the surface on which the image is formed on said second object and wherein light from the pattern on said first object is split into a plurality of beams, which advance through the plurality of corresponding said projection optical units to reach said second object.

12. The projection exposure apparatus according to claim 11, wherein said second stage is arranged as movable in a direction substantially parallel to the surface on which the image is formed on said second object, wherein said first stage is arranged as movable in the substantially same direction as the moving direction of said second stage, and wherein positions of two images formed on said second object by two adjacent ones out of said plurality of projection optical units are shifted from each other in a direction parallel to the moving direction of said second stage.

* * * * *